(12) United States Patent
Kim et al.

(10) Patent No.: US 11,600,556 B2
(45) Date of Patent: Mar. 7, 2023

(54) SEMICONDUCTOR PACKAGE

(71) Applicant: Samsung Electronics Co., Ltd., Suwon-si (KR)

(72) Inventors: Minki Kim, Suwon-si (KR); Duckgyu Kim, Suwon-si (KR); Jae-Min Jung, Seoul (KR); Jeong-Kyu Ha, Hwaseong-si (KR); Sang-Uk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 17/230,662

(22) Filed: Apr. 14, 2021

(65) Prior Publication Data

US 2022/0068771 A1 Mar. 3, 2022

(30) Foreign Application Priority Data

Sep. 1, 2020 (KR) .................. 10-2020-0111079

(51) Int. Cl.
| | |
|---|---|
| *H01L 23/495* | (2006.01) |
| *H01L 23/31* | (2006.01) |
| *H01L 23/00* | (2006.01) |
| *H01L 23/367* | (2006.01) |

(52) U.S. Cl.
CPC .... *H01L 23/49537* (2013.01); *H01L 23/3157* (2013.01); *H01L 23/367* (2013.01); *H01L 23/49503* (2013.01); *H01L 23/49551* (2013.01); *H01L 23/49575* (2013.01); *H01L 24/32* (2013.01); *H01L 2224/32245* (2013.01)

(58) Field of Classification Search
None
See application file for complete search history.

(56) References Cited

U.S. PATENT DOCUMENTS

| | | | |
|---|---|---|---|
| 6,221,749 B1 | 4/2001 | Kirloskar et al. | |
| 6,867,490 B2 | 3/2005 | Toyosawa | |
| 9,224,705 B2 | 12/2015 | Tajimi | |
| 2005/0093177 A1* | 5/2005 | Liu ................... | H01L 23/49551 257/E23.047 |

(Continued)

FOREIGN PATENT DOCUMENTS

| | | | | |
|---|---|---|---|---|
| CN | 1545828 A | * | 11/2004 | ....... H01L 23/49805 |
| EP | 3751464 A1 | * | 12/2020 | ....... G06K 19/07747 |

(Continued)

*Primary Examiner* — Telly D Green
(74) *Attorney, Agent, or Firm* — Muir Patent Law, PLLC

(57) ABSTRACT

Disclosed is a semiconductor package comprising a semiconductor chip, a first chip pad on a bottom surface of the semiconductor chip and adjacent to a first lateral surface in a first direction of the semiconductor chip, the first lateral surface separated from the first chip pad from a plan view in a first direction, and a first lead frame coupled to the first chip pad. The first lead frame includes a first segment on a bottom surface of the first chip pad and extending from the first chip pad in a second direction opposite to the first direction and away from the first lateral surface of the semiconductor chip, and a second segment which connects to a first end of the first segment and then extends along the first direction to extend beyond the first lateral surface of the semiconductor chip after passing one side of the first chip pad, when viewed in the plan view.

20 Claims, 13 Drawing Sheets

(56) References Cited

U.S. PATENT DOCUMENTS

| | | | |
|---|---|---|---|
| 2005/0127494 A1* | 6/2005 | Liu | H01L 23/3107 |
| | | | 257/676 |
| 2005/0212142 A1 | 9/2005 | Miyazaki et al. | |
| 2006/0145315 A1 | 7/2006 | Shen et al. | |
| 2008/0064140 A1 | 3/2008 | Uchida | |
| 2014/0210062 A1* | 7/2014 | Miyazaki | H01L 23/49541 |
| | | | 257/676 |
| 2015/0206831 A1* | 7/2015 | Bai | H01L 21/565 |
| | | | 257/667 |
| 2017/0148742 A1 | 5/2017 | Kim | |
| 2018/0096920 A1* | 4/2018 | Adriano | H01L 23/49575 |
| 2019/0392283 A1* | 12/2019 | Finn | G06K 19/0723 |

FOREIGN PATENT DOCUMENTS

| | | | |
|---|---|---|---|
| JP | 2000208693 A * | 7/2000 | |
| KR | 100771890 B1 | 11/2007 | |
| KR | 1020170060410 A | 6/2017 | |

* cited by examiner

SEMICONDUCTOR PACKAGE

CROSS-REFERENCE TO RELATED APPLICATION

This U.S. nonprovisional application claims priority under 35 U.S.C. § 119 to Korean Patent Application No. 10-2020-0111079, filed on Sep. 1, 2020, in the Korean Intellectual Property Office, the entire contents of which are hereby incorporated by reference.

BACKGROUND

The present inventive concepts relate to a semiconductor package, and more particularly, to a semiconductor package with a lead frame.

In the semiconductor industry, integrated circuit packaging technology has been developed to satisfy requirements for small-form-factor devices and high package reliability. For instance, package techniques capable of achieving a chip-sized packages are actively being developed to satisfy the requirements for small-form-factor devices, and package techniques capable of promoting efficiency in a package process and improving mechanical and electrical reliability of a packaged product have attracted considerable attention in terms of high package reliability.

Chip-on-film (COF) technology is a new type of package that has been developed on a display driver IC with the trend of light, thin, and compact-sized communication equipment. When a high-resolution display device is implemented with the COF technology, driving frequencies of televisions and monitors are increased to increase driving loads of the driver IC, which results in heat generation from integrated circuits. As an approach to address these issues, a thermal radiation plate may be formed on a bottom surface of a dielectric layer so as to externally discharge heat produced from a semiconductor device formed on a top surface of the dielectric substrate. However, other or additional approaches may be desirable.

SUMMARY

Some example embodiments of the present inventive concepts provide a semiconductor package with improved structural stability.

Some example embodiments of the present inventive concepts provide a semiconductor package with enhanced electrical characteristics.

An object of the present inventive concepts is not limited to those mentioned above, and other objects which have not been mentioned above will be clearly understood to those skilled in the art from the following description.

According to some example embodiments of the present inventive concepts, a semiconductor package may comprise: a semiconductor chip; a first chip pad on a bottom surface of the semiconductor chip and adjacent to a first lateral surface in a first direction of the semiconductor chip, the first lateral surface separated from the first chip pad from a plan view in a first direction; and a first lead frame coupled to the first chip pad. The first lead frame may include: a first segment on a bottom surface of the first chip pad, the first segment extending in a second direction from the first chip pad, the second direction being opposite to the first direction and away from the first lateral surface of the semiconductor chip; and a second segment which connects to a first end of the first segment and then extends along the first direction to extend beyond the first lateral surface of the semiconductor chip after passing one side of the first chip pad, when viewed in the plan view.

According to some example embodiments of the present inventive concepts, which may be the same or different embodiment as the previously-mentioned example embodiment, a semiconductor package may comprise: a thermal radiation member; a substrate on the thermal radiation member; a lead frame on the substrate; a semiconductor chip which is disposed on the lead frame and whose bottom surface has a central region and a peripheral region which surrounds the central region; and a chip pad which is provided on the peripheral region of the bottom surface of the semiconductor chip and which couples the semiconductor chip to the lead frame. The lead frame may include: a first segment which extends from a bottom surface of the chip pad onto the central region of the bottom surface of the semiconductor chip; a second segment which extends from the central region toward an outside of the semiconductor chip; and a connection segment through which the first segment and the second segment are connected to each other on the central region.

According to some example embodiments of the present inventive concepts, which may be the same or different embodiment as the previously-mentioned example embodiment, a semiconductor package may comprise: a thermal radiation member; a substrate on the thermal radiation member; a lead frame on the substrate, the lead frame having a hook shape in which a first end of a first segment is connected to a first end of a second segment, the first and second segments extending in a first direction; and a semiconductor chip which includes a chip pad coupled to the first segment. A connection segment that connects the first and second segments to each other may be more distant than the chip pad from a first lateral surface of the semiconductor chip. The first lateral surface may be adjacent to the chip pad.

DETAILED DESCRIPTION OF EMBODIMENTS

The following will now describe a semiconductor package according to the present inventive concepts with reference to the accompanying drawings.

Figure 1:
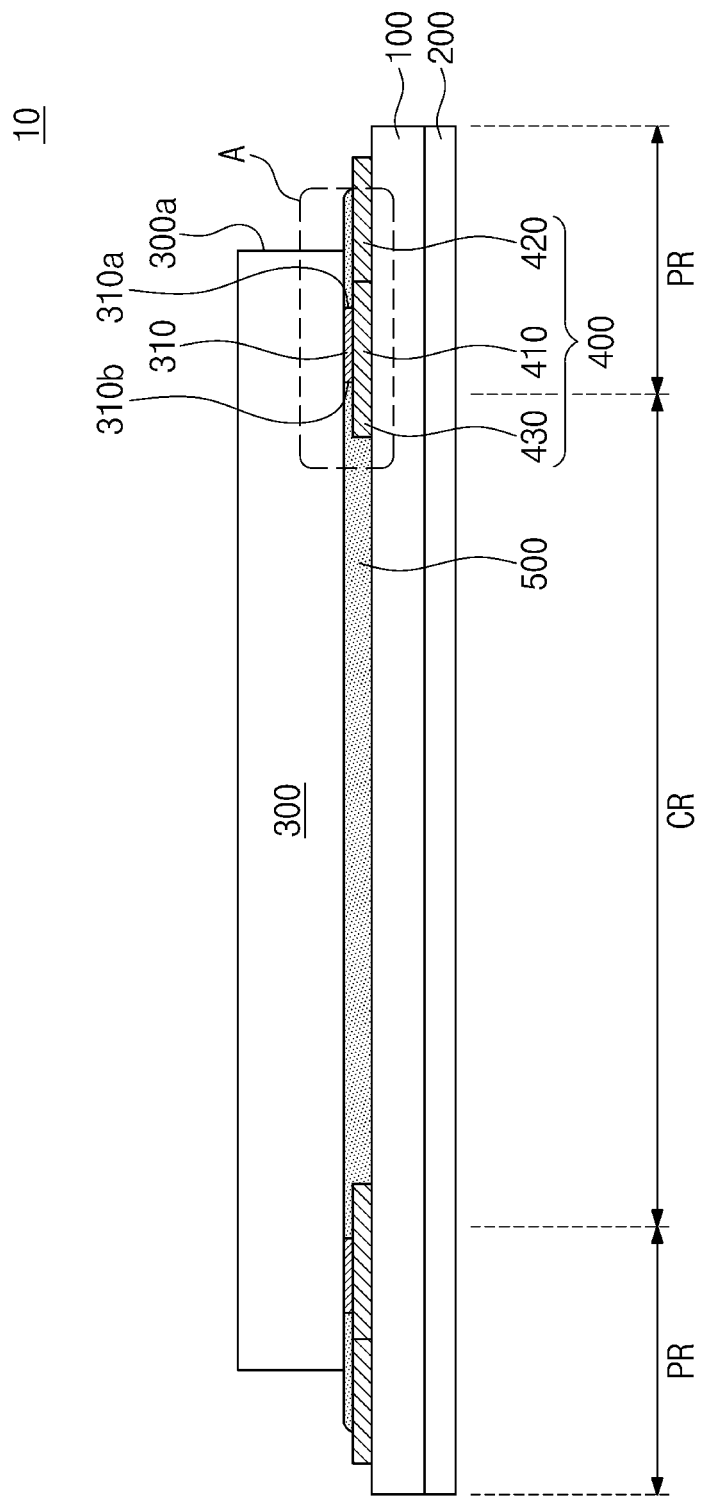
FIG. 1 is a cross-sectional view illustrating a semiconductor package according to some example embodiments of the present inventive concepts.
Figure 2:
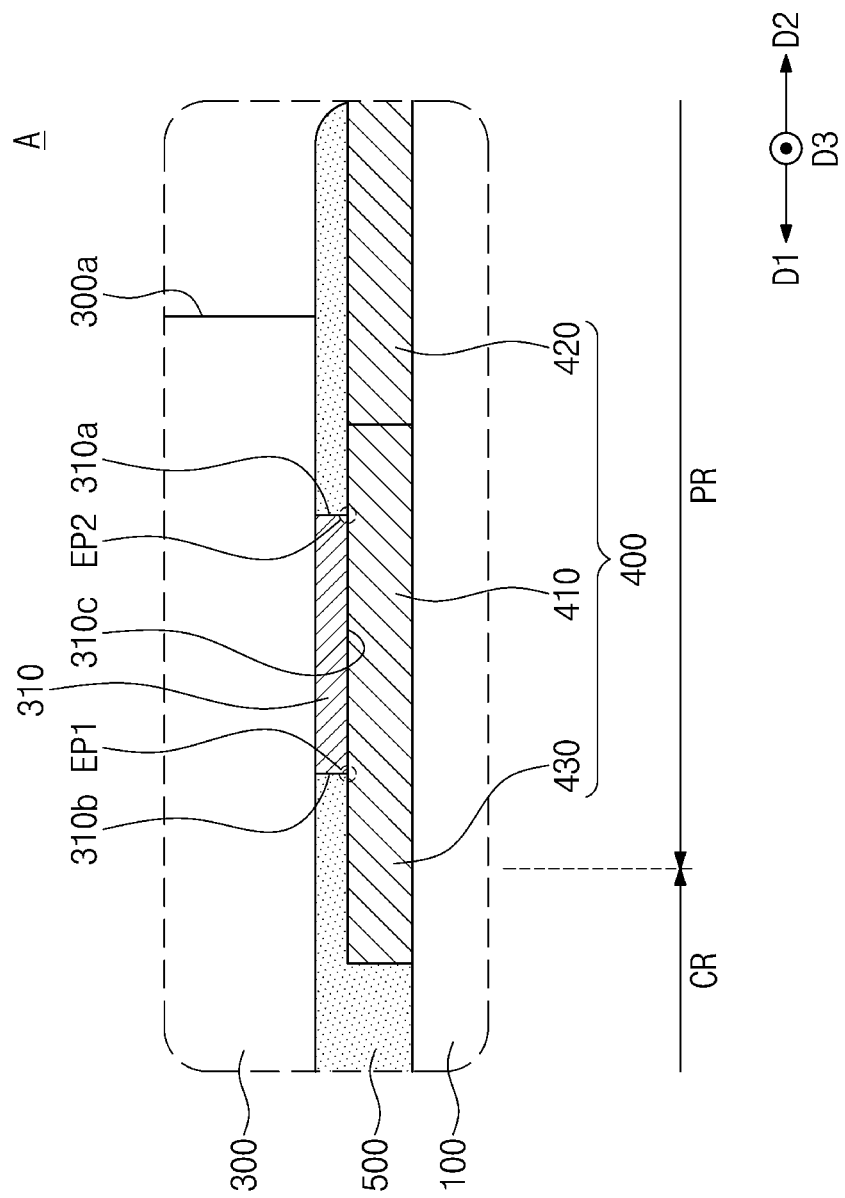
FIG. 2 is an enlarged view illustrating section A of FIG. 1.
Figure 3:
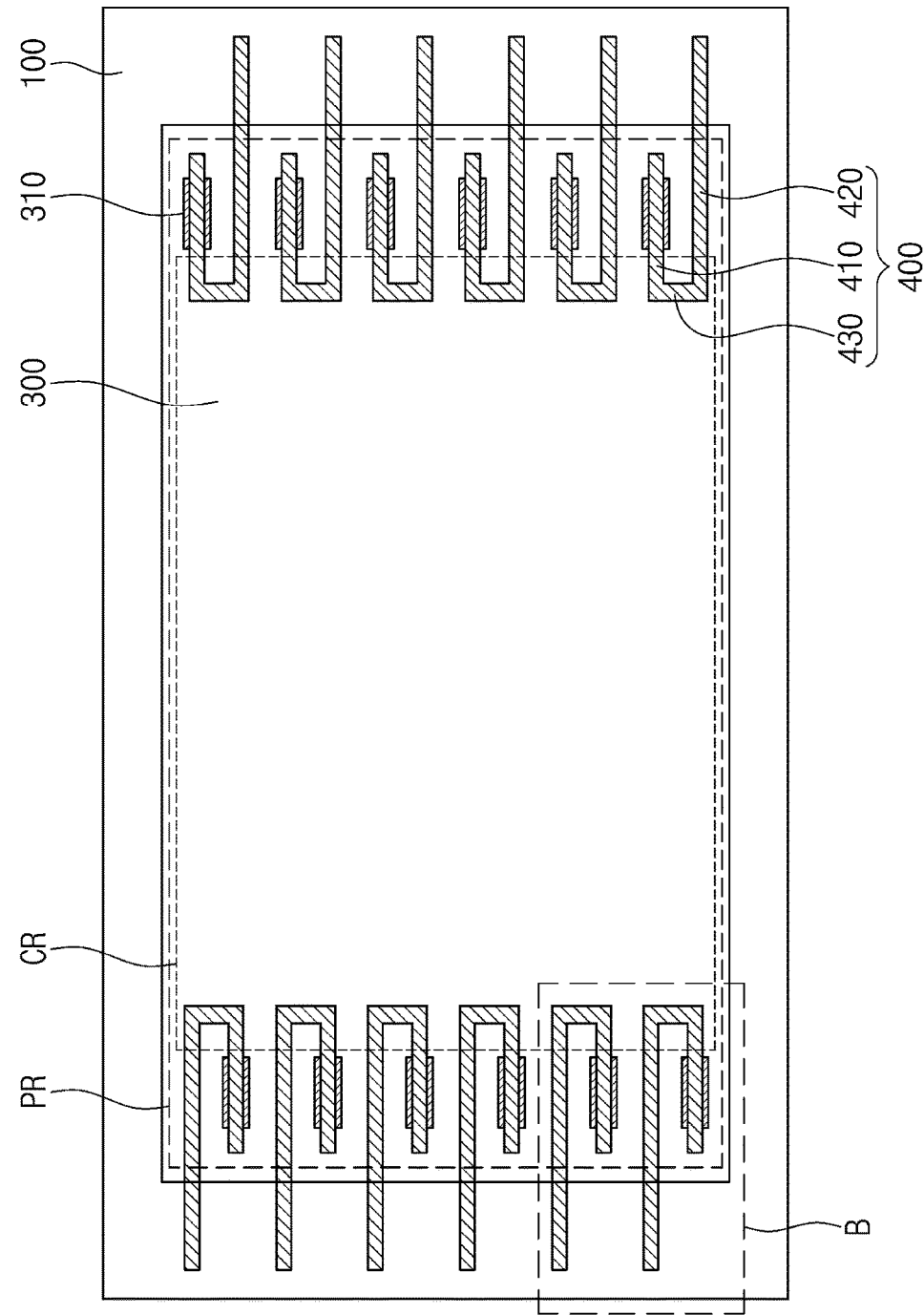
FIG. 3 is a plan view illustrating a semiconductor package according to some example embodiments of the present inventive concepts.
Figure 4:
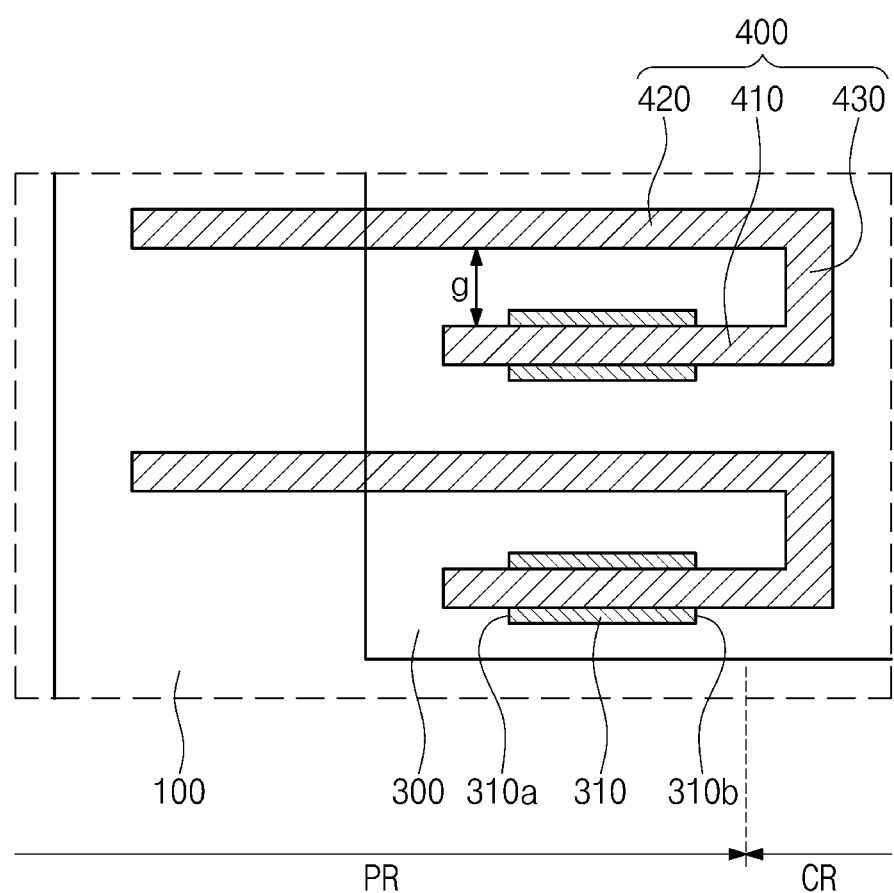
FIG. 4 is an enlarged view illustrating section B of FIG. 3.

FIG. 1 is a cross-sectional view illustrating a semiconductor package according to some example embodiments of the present inventive concepts. FIG. 2 is an enlarged view illustrating section A of FIG. 1. FIG. 3 is a cross-sectional view, corresponding to a bottom view of FIG. 1, illustrating a semiconductor package according to some example embodiments of the present inventive concepts. In FIG. 3, some component elements are illustrated overlapping each other for convenience of description. FIG. 4 is an enlarged view illustrating section B of FIG. 3.

Referring to FIGS. 1 to 3, a semiconductor package 10 may include a substrate 100, a thermal radiation member 200 provided on one surface of the substrate 100, lead frames 400 provided on another surface of the substrate 100, and a semiconductor chip 300 mounted on the substrate 100. For example, the semiconductor package 10 may be a chip-on-film (COF) type semiconductor device.

The substrate 100 may be a flexible film type substrate. The substrate 100 may include a dielectric material. For example, the substrate 100 may include polyimide (PI).

The thermal radiation member 200 may be disposed on a bottom surface of the substrate 100. The thermal radiation member 200 may entirely cover the bottom surface of the substrate 100. Alternatively, differently from that shown, the thermal radiation member 200 may be disposed on the bottom surface of substrate 100 only below a region where the semiconductor chip 300 is mounted. The thermal radiation member 200 may contact the bottom surface of the substrate 100. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The thermal radiation member 200 may have a thickness of about 1 mm to about 10 mm The thermal radiation member 200 may be provided to externally discharge heat that is generated from the semiconductor chip 300 and then transferred downwardly through the lead frames 400. The thermal radiation member 200 may include a metal conductor or a nonconductor (e.g., non-electrically conductive material) with high thermal conductivity. For example, the thermal radiation member 200 may include aluminum (Al). The thermal radiation member 200 may be a sheet or a thermally-conductive pattern, and may be a thermal radiation sheet or thermal radiation pattern.

Although not shown, an adhesive layer may be used to attach the thermal radiation member 200 to the substrate 100. The adhesive layer may include an adhesive member such as an acrylic adhesive. In addition, the adhesive layer may include conductive particles. For example, the conductive particles may include metal particles or metal balls. The conductive particles may allow the adhesive layer to easily provide the thermal radiation member 200 with heat that is transferred from the substrate 100.

The lead frames 400 may be provided on the substrate 100. The shape of the lead frames 400 will be discussed in detail after explaining the shape of the semiconductor chip 300 which will be described below.

The semiconductor chip 300 may be mounted on the substrate 100. The semiconductor chip 300 may be or may include a memory device, an integrated circuit, a transistor such as a junction transistor and a field effect transistor, a diode such as a rectifier diode, a light emitting diode, and a photodiode, or any other active device. Alternatively, the semiconductor chip 300 may be or may include a condenser, a resistor, a coil, or any other passive device. The semiconductor chip 300 may have a central region CR and a peripheral region PR that surrounds the central region CR, when viewed in plan. The semiconductor chip 300 may be flip-chip mounted on the substrate 100. For example, a front surface of the semiconductor chip 300 may face the substrate 100. In this description below, the term "front surface" may be defined to refer to an active surface on which is formed a circuit layer of the semiconductor chip 300, and the term "rear surface" may be defined to refer to an opposing surface, or an inactive surface opposite to the front surface. For example, the first semiconductor chip 300 may include chip pads 310 provided on the front surface thereof. The chip pads 310 may be positioned on the peripheral region PR of the semiconductor chip 300. A surface of the chip pads 310 may face the substrate 100. The chip pads 310 may each have a first lateral surface 310a and a second lateral surface 310b. For example, when the semiconductor chip 300 is defined to have a third lateral surface 300a to which the chip pad 310 is adjacent, the first lateral surface 310a of the chip pad 310 may face a direction toward the third lateral surface 300a, and the second lateral surface 310b of the chip pad 310 may be opposite to the third lateral surface 300a. In this case, the second lateral surface 310b of the chip pad 310 may face the central region CR, and the first lateral surface 310a of the chip pad 310 may face the peripheral region PR or an outside of the semiconductor chip 300. A distance from the third lateral surface 300a of the semiconductor chip 300 to the second lateral surface 310b of one chip pad 310 may be about 0.1% to about 10% of a width of the semiconductor chip 300.

It should be noted that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). Also, terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The semiconductor chip 300 may be coupled to the lead frames 400 provided on a top surface of the substrate 100.

For example, the chip pads 310 of the semiconductor chip 300 may contact the lead frames 400.

The lead frames 400 may be provided on the substrate 100 and connected to the chip pads 310 of the semiconductor chip 300. On the substrate 100, the lead frames 400 may serve to transfer electrical signals from the semiconductor chip 300 toward an external output apparatus. The lead frames 400 may be disposed spaced apart from each other. The lead frames 400 may have their distal ends that extend to an outside of the semiconductor chip 300. The lead frames 400 may include metal, such as copper (Cu).

The following will discuss the shape of the lead frames 400 with reference to FIGS. 3 and 4.

The lead frames 400 may each have a bracket shape that extends from the chip pad 310 toward the central region CR of the semiconductor chip 300 and then extends from the central region CR toward the peripheral region PR of the semiconductor chip 300. For example, the lead frames 400 may each include a first segment 410 connected to (e.g., directly connected to and contacting) the chip pad 310, a second segment 420 that extends from the first segment 410 toward an outside of the semiconductor chip 300, and a connection segment 430 that connects the first segment 410 to the second segment 420. The first and second segments 410 and 420 may be legs of the lead frame 400, which has a bent shape. In this description, the first, second, and third segments 410, 420, and 430 are arbitrarily divided for convenience of explanation, and the lead frame 400 may be formed of the same material throughout as a single, unitary piece (e.g., a single integrated structure). The following will discuss the shape of a single lead frame 400 provided below one chip pad 310. Each lead frame 400 may have the same shape, and the same size, as the other lead frames. The lead frames 400 may each have a bent shape, such as a hook shape, or a J shape (or reverse J shape), which may be an angular shape as depicted in FIGS. 3 and 4, for example including 90 degree angles.

The first segment 410 may have a straight, linear shape that extends in a first direction D1 from a bottom surface 310c of the chip pad 310. In this description, the first direction D1 may be defined to refer to an inward direction of the semiconductor chip 300 from the chip pad 310 (e.g., toward a center of the semiconductor chip 300 and away from an adjacent edge of the semiconductor chip 300). For example, the first direction D1 may be directed from the peripheral region PR toward the central region CR. A second direction D2 may be defined to refer to an outward direction of the semiconductor chip 300 from the chip pad 310. For example, the second direction D2 may be directed from the central region CR toward the peripheral region PR. The first segment 410 may extend in the first direction D1 from the chip pad 310. For example, from a plan view, the first segment 410 may protrude from the second lateral surface 310b of the chip pad 310. The first segment 410 may have a first end (e.g., an end connected to the third segment 430) positioned a particular distance in the first direction D1 from the chip pad 310. The first segment 410 may have a second end (e.g., a terminal end) positioned a particular distance in the second direction D2 from the chip pad 310. For example, from the plan view, the first segment 410 may have a portion that protrudes from the first lateral surface 310a of the chip pad 310 and a portion that protrudes from the second lateral surface 310b of the chip pad 310. Differently from that shown, the second end (e.g., terminal end) of the first segment 410 may be positioned below a bottom surface of the chip pad 310, to overlap the chip pad 310 from a plan view. The second end of the first segment 410 may serve as a pad to which the chip pad 310 of the semiconductor chip 300 is coupled.

The second segment 420 may have a straight, linear shape that extends in the second direction D2 from the central region CR. The second segment 420 may have a third end (e.g., an end connected to the third segment 430) positioned on the central region CR (e.g., closer to the center of the substrate 100). When viewed in plan view, the second segment 420 may protrude beyond the third lateral surface 300a of the semiconductor chip 300 after passing through the peripheral region PR from the central region CR. The third end of the second segment 420 may be positioned on the central region CR. The second segment 420 may have a fourth end (e.g., a terminal end) positioned on an outside of the semiconductor chip 300, from a plan view. The fourth end of the third segment 420 may correspond to a terminal to which an external output apparatus connects. The second segment 420 may be spaced apart in a third direction D3 from the first segment 410. The third direction D3 may be defined to refer to a direction that is parallel to the top surface of the substrate 100 and intersects the first and second directions D1 and D2. The third direction D3 may be perpendicular to the first and second directions D1 and D2. For example, the first and second segments 410 and 420 may have their linear shapes that are arranged in the third direction D3, and that extend lengthwise in the first and second directions D1 and D2. An item, layer, or portion of an item or layer described as extending "lengthwise" in a particular direction has a length in the particular direction and a width perpendicular to that direction, where the length is greater than the width. A spacing distance g between the first and second segments 410 and 420 may range from about 10 µm to about 100 µm. The second segment 420 may be spaced apart in the third direction D3 from the chip pad 310.

The second segment 420 may be positioned adjacent to one side (e.g., one lengthwise side) of the first segment 410. The first and second segments 410 and 420 may be located at the same vertical level from the top surface of the substrate 100.

The first and second segments 410 and 420 may be connected to each other. For example, the first end of the first segment 410 and the third end of the second segment 420 may be connected through the connection segment 430 to each other on the central region CR. The connection may be boundary-less, in an embodiment where the lead frame 400 is a unitary piece. The connection segment 430 may be positioned on the central region CR. The connection segment 430 may have a linear shape that extends in the third direction D3 from the first end of the first segment 410 toward the third end of the second segment 420. Therefore, the lead frames 400 may each have a bracket shape including the first segment 410 that extends from the chip pad 310 toward the central region CR of the semiconductor chip 300, the connection segment 430 that connects the first segment 410 to the second segment 420, and the second segment 420 that extends from the central region CR toward the peripheral region PR. One end of the bracket may be elongated with respect to the other end.

Figure 5:
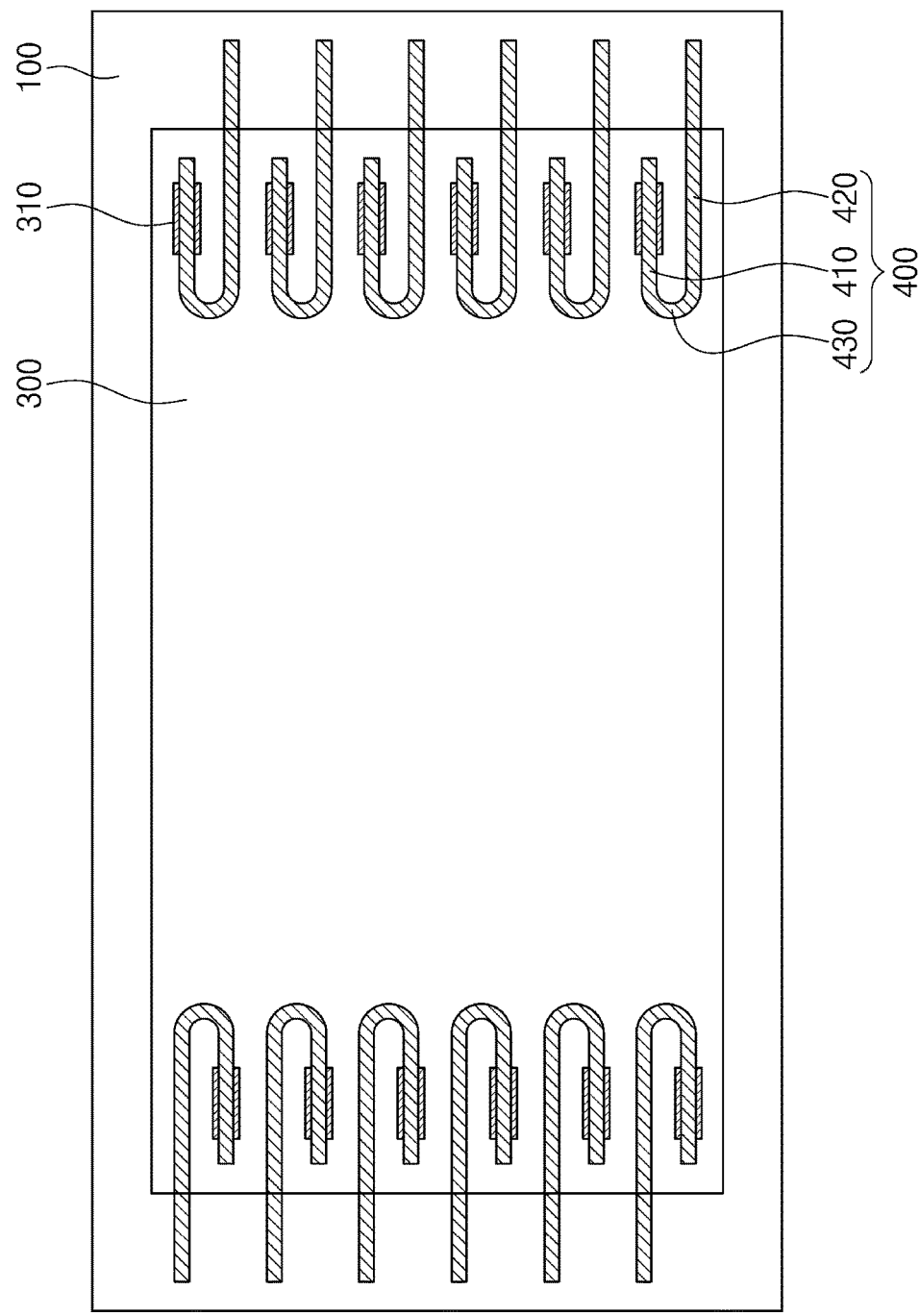
FIGS. 5 and 6 are plan views illustrating a semiconductor package according to some example embodiments of the present inventive concepts.

Alternatively, the lead frame 400 may have a curved U shape (e.g., with one elongated end), or curved J shape (or reverse J shape) or hook shape. FIG. 5 is a plan view illustrating a semiconductor package according to some example embodiments of the present inventive concepts. As shown in FIG. 5, the connection segment 430 may have a bent shape including a curved shape that bends in a rounded manner from the first end of the first segment 410 toward the third end of the second segment 420. In this disclosure, though examples are given, of different bent shapes and other shapes, the shape of the connection segment 430 and the shape of the lead frame 400 is not so limited, and the first and second segments 410 and 420 may be connected to each other in various ways. The following will focus on the embodiment of FIG. 3.

Referring to FIGS. 1 and 2, in the case of the semiconductor package 10 in which the lead frames 400 are provided on the substrate 100 and the thermal radiation member 200, and in which the semiconductor chip 300 is coupled to the lead frames 400, each of the substrate 100, the thermal radiation member 200, and the semiconductor chip 300 may undergo a thermal expansion caused by heat that is provided during fabrication of the semiconductor package 10 or is generated from the semiconductor chip 300 during operation of the semiconductor package 10. There may be a difference between a coefficient of thermal expansion (CTE) of the substrate 100 and the thermal radiation member 200 and a coefficient of thermal expansion (CTE) of the semiconductor chip 300, and stress may be applied to the lead frames 400 through which the semiconductor chip 300 and the substrate 100 are connected to each other. In this case, the stress resulting from the difference in CTE between the semiconductor chip 300 and the substrate 100 may be less at a central portion (e.g., the central region CR of the semiconductor chip 300 or a central portion of the substrate 100) of the semiconductor package 10, and may be greater at an outer portion (e.g., the peripheral region PR of the semiconductor chip 300 or an outer portion of the substrate 100) of the semiconductor package 10. Referring to FIG. 2, a contact area between the lead frame 400 and the chip pad 310 may have a first point EP1 most adjacent to the second lateral surface 310b directed toward the central region CR and a second point EP2 most adjacent to the first lateral surface 310a directed toward an outside of the semiconductor chip 300, and the stress applied to the lead frame 400 may be less at the first point EP1 than at the second point EP2.

At the second point EP2 to which the thermal stress is heavily applied, the lead frame 400 may suffer from cracks caused by stress continuously applied around the second point EP2 or may be delaminated from the chip pad 310.

According to some example embodiments of the present inventive concepts, the lead frame 400 may include a portion that is positioned around the first point EP1 to which the stress is less heavily applied and is further away from an interconnection line of the lead frame 400 that extends away from the substrate 100, and may also include another portion that constitutes the interconnection line of the lead frame 400 and extends from below the bottom surface 310c of the chip pad 310 toward the first lateral surface 310a at which the stress occurs more. However, where the stress occurs more, there is no immediate nearby connection between the interconnection line of the lead frame 400 that connects externally, and the chip pad 310, and so the interconnection line of the lead frame 400 may be subject to less stress than in prior art systems, and the semiconductor package 10 may be more highly resistant to heat-induced stress. As a result, the semiconductor package 10 may increase in structural stability. In addition, because lead frame 400 is free of cracks, the lead frame 400 may decrease in resistance, and the semiconductor package 10 may increase in desired electrical characteristics.

Referring back to FIGS. 1 to 4, an under-fill member 500 may be provided between the substrate 100 and the semiconductor chip 300. The under-fill member 500, also described as an under-fill or under-fill layer may fill a space between the substrate 100 and the semiconductor chip 300. The under-fill member 500 may encapsulate the chip pads 310, the first segments 410 of the lead frames 400, and the connection segments 430 of the lead frames 400, and may partially cover the second segments 420 of the lead frames 400. The under-fill member 500 may include an underfill material and structure such as, for example, an anisotropic conductive film (ACF) or a non-conductive paste (NCP).

Although not shown, a surface dielectric layer may further be provided on the substrate 100. The surface dielectric layer may partially cover the lead frames 400 (or at least the second segments 420 of the lead frames 400) that extend toward an outside of the semiconductor chip 300. For example, a solder resist layer may be used as the surface dielectric layer. The surface dielectric layer may be provided to cover the lead frames 400.

Figure 6:
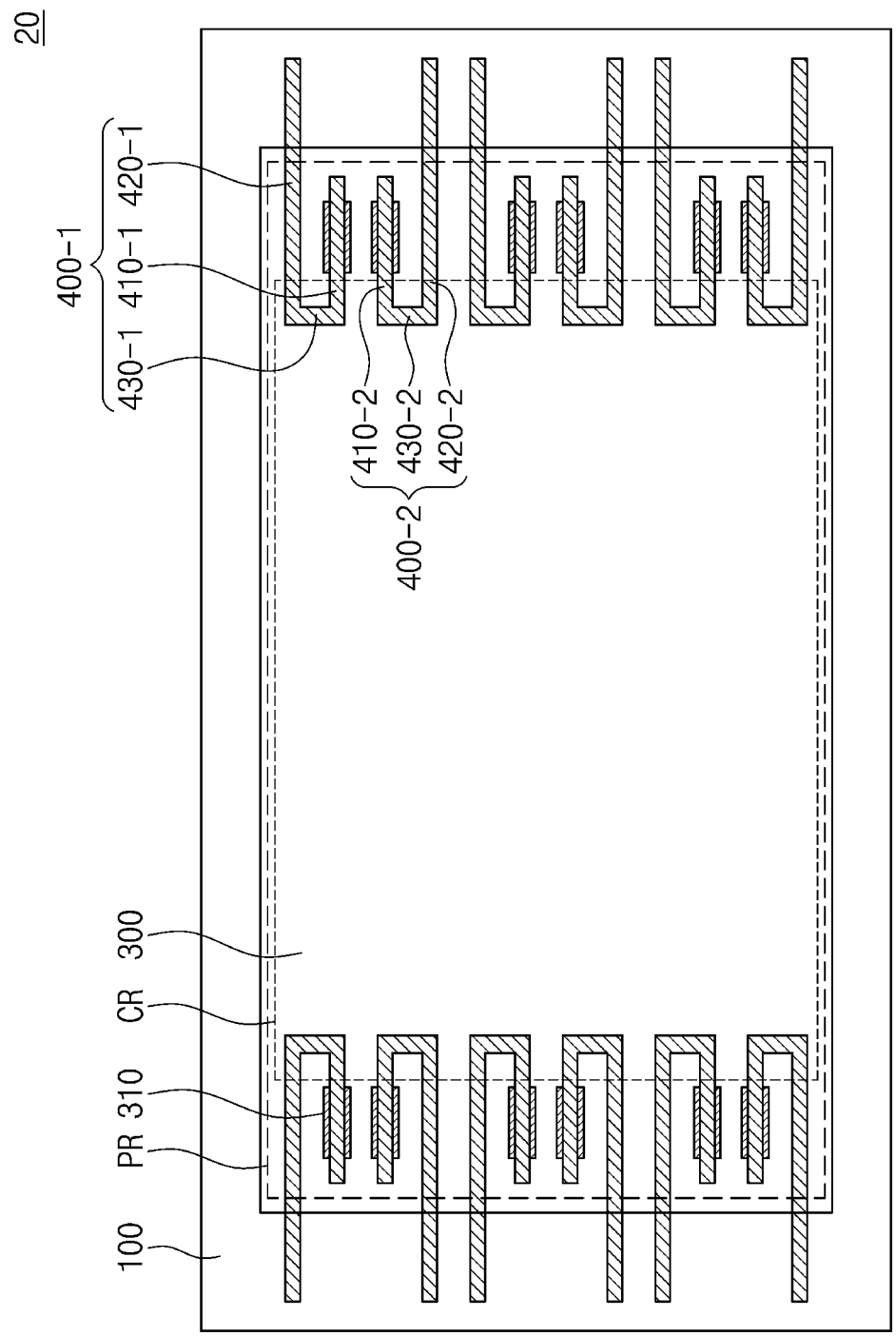

FIG. 3 depicts that the lead frames 400 have the same planar shape (e.g., from a plan view), though some lead frames 400 are oriented with 180 degree rotation compared to others, but the present inventive concepts are not limited thereto. FIG. 6 is a plan view illustrating a semiconductor package according to some example embodiments of the present inventive concepts. In the embodiment that follows, a detailed description of technical features repetitive to those discussed with reference to FIGS. 1 to 4 will be omitted, and a difference thereof will be discussed in detail. The same reference numerals may be allocated to the same components as those of the semiconductor package according to some example embodiments of the present inventive concepts.

Referring to FIG. 6, a semiconductor package 20 may include a substrate 100, a thermal radiation member 200 provided on one surface of the substrate 100, lead frames 400 provided on another surface of the substrate 100, and a semiconductor chip 300 mounted on the substrate 100. For example, the semiconductor package 20 may be a chip-on-film (COF) type semiconductor device.

The thermal radiation member 200 may be disposed on a bottom surface of the substrate 100. The thermal radiation member 200 may be in contact with the bottom surface of the substrate 100. The thermal radiation member 200 may be provided to externally discharge heat that is generated from the semiconductor chip 300 and then transferred downwardly through the lead frames 400.

The semiconductor chip 300 may be mounted on the substrate 100. The semiconductor chip 300 may include chip pads 310 provided on a front surface thereof The chip pads 310 may be positioned on a peripheral region PR of the semiconductor chip 300. The semiconductor chip 300 may be coupled to the lead frames 400 provided on a top surface of the substrate 100. For example, the chip pads 310 of the semiconductor chip 300 may contact the lead frames 400.

The lead frames 400 may be provided on the substrate 100 and connected to the chip pads 310 of the semiconductor chip 300. The lead frames 400 may each have a bent shape such as a bracket shape (e.g., with one elongated end), or hook shape, that extends from the chip pad 310 toward a central region CR of the semiconductor chip 300 and then extends from the central region CR toward the peripheral region PR.

The lead frames 400 may include a first lead frame 400-1 (e.g., first type of lead frame, of which there may be a plurality) and a second lead frame 400-2 (e.g., second type of lead frame, of which there may be a plurality) that are adjacent to each other. The first and second lead frames 400-1 and 400-2 may have their planar shapes that are symmetrical to each other when viewed in a plan view. For example, the first and second lead frames 400-1 and 400-2 may have their respective first segments 410-1 and 410-2 each having a straight, linear shape that extends from the chip pad 310 toward the central region CR of the semiconductor chip 300. The first and second lead frames 400-1 and 400-2 may have their respective second segments 420-1 and 420-2 each having a straight, linear shape that extends from the central region CR of the semiconductor chip 300 toward an outside of the semiconductor chip 300. When the second segment 420-1 of the first lead frame 400-1 is spaced apart in a fourth direction, parallel to a top surface of the substrate 100, from the first segment 410-1 of the first lead frame 400-1, the second segment 420-2 of the second lead frame 400-2 may be spaced apart in a direction, opposite to the fourth direction, from the first segment 410-2 of the second lead frame 400-2. The first lead frame 400-1 may have a connection segment 430-1 through which the first and second segments 410-1 and 420-1 of the first lead frame 400-1 are connected to each other on the central region CR, and the second lead frame 400-2 may have a connection segment 430-2 through which the first and second segments 410-2 and 420-2 of the second lead frame 400-2 are connected to each other on the central region CR. Though FIG. 6 depicts bracket shaped lead frames that form a bent, hook shape such as straight-line J shapes or reverse J shapes, in one embodiment, the lead frames depicted in FIG. 6 can have curved type connection segments, similar to those shown in FIG. 5.

Figure 7:
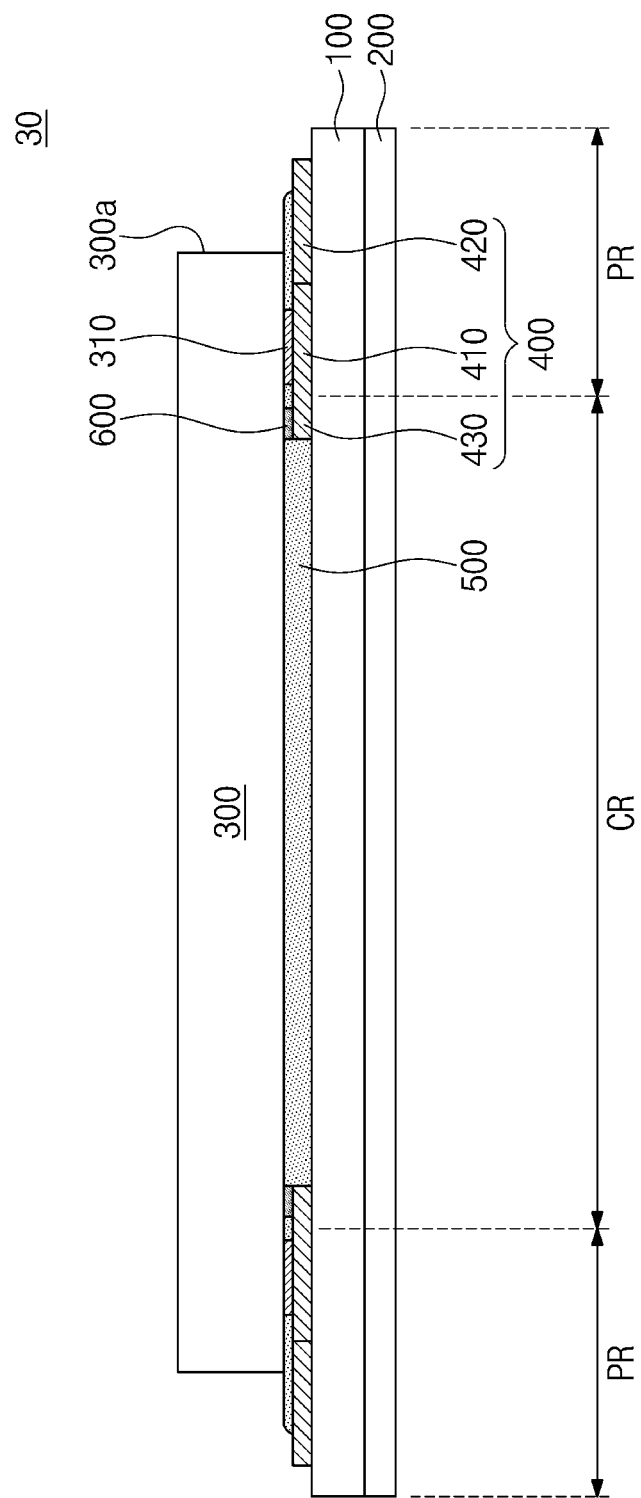
FIG. 7 is a cross-sectional view illustrating a semiconductor package according to some example embodiments of the present inventive concepts.
Figure 8:
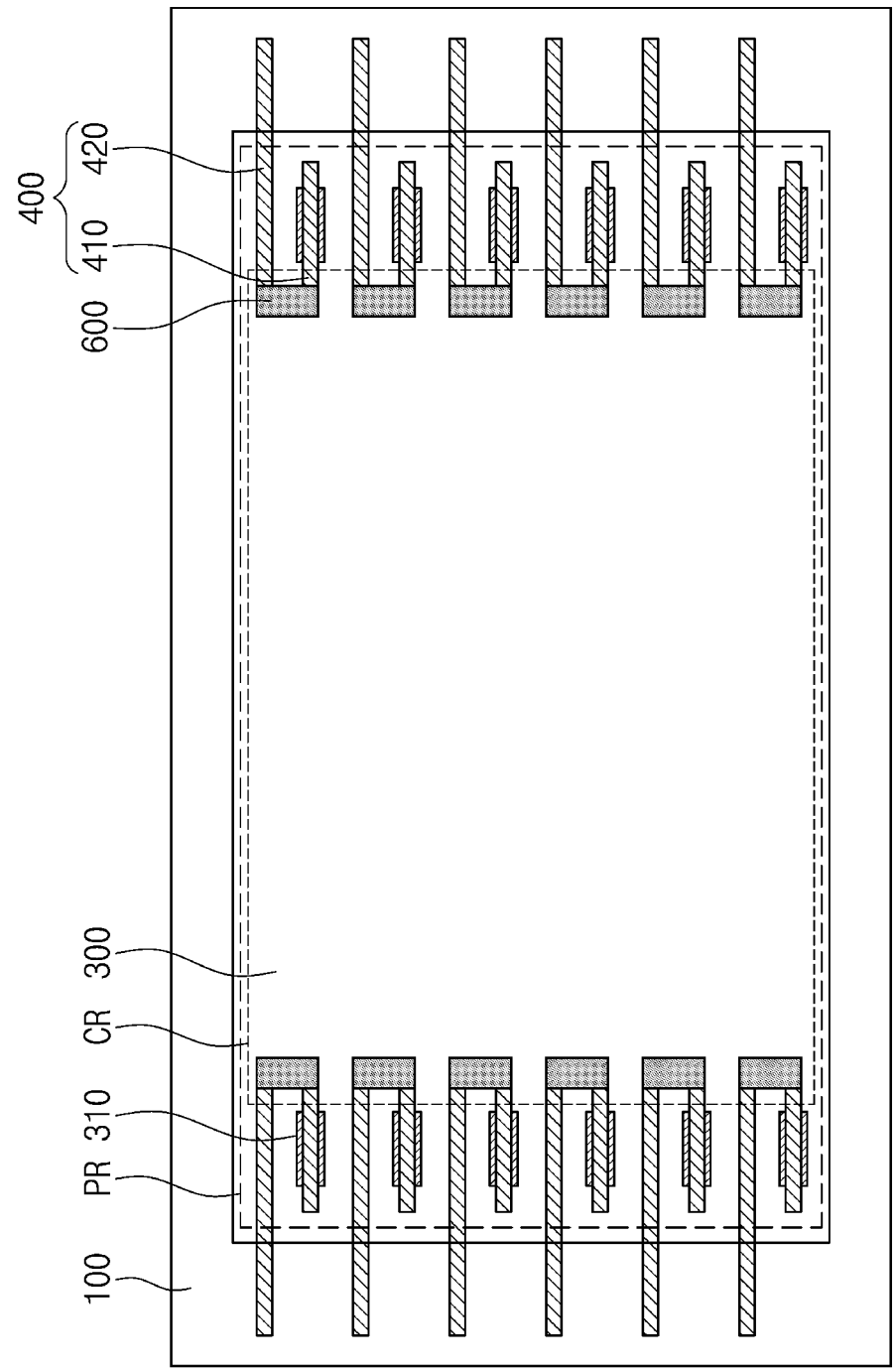
FIG. 8 is a plan view illustrating a semiconductor package according to some example embodiments of the present inventive concepts.

FIG. 7 is a cross-sectional view illustrating a semiconductor package according to some example embodiments of the present inventive concepts. FIG. 8 is a plan view illustrating a semiconductor package according to some example embodiments of the present inventive concepts.

Referring to FIGS. 7 and 8, a semiconductor package 30 may include a substrate 100, a thermal radiation member 200 provided on one surface of the substrate 100, lead frames 400 provided on another surface of the substrate 100, a semiconductor chip 300 mounted on the substrate 100, and supporters 600 that support the semiconductor chip 300. For example, the semiconductor package 30 may be a chip-on-film (COF) type semiconductor device.

The thermal radiation member 200 may be disposed on a bottom surface of the substrate 100. The thermal radiation member 200 may contact the bottom surface of the substrate 100.

The semiconductor chip 300 may be mounted on the substrate 100. The semiconductor chip 300 may include chip pads 310 provided on a front surface thereof. The chip pads 310 may be positioned on a peripheral region PR of the semiconductor chip 300. The semiconductor chip 300 may be coupled to the lead frames 400 provided on a top surface of the substrate 100.

The lead frames 400 may be provided on the substrate 100 and may be connected to the chip pads 310 of the semiconductor chip 300. The lead frames 400 may each have a bent shape such as a bracket shape (e.g., with one elongated end), or hook shape, that extends from the chip pad 310 toward a central region CR of the semiconductor chip 300 and then extends from the central region CR toward the peripheral region PR, when viewed in a plan view. For example, the lead frames 400 may each include a first segment 410 connected to the chip pad 310, a second segment 420 that extends from the first segment 410 toward an outside of the semiconductor chip 300, and a connection segment 430 that connects the first segment 410 to the second segment 420.

The supporters 600 may be provided between the semiconductor chip 300 and the lead frames 400. The supporters 600 may be disposed on the central region CR. Each of the supporters 600 may be interposed between the semiconductor chip 300 and the connection segment 430 of one of the lead frames 400. The supporters 600 may be formed on and may contact top surfaces of the connection segments 430 of the lead frames 400 and a rear surface of the semiconductor chip 300. For example, the semiconductor chip 300 may be supported by the supporters 600 on the connection segments 430. As the supporters 600 support the semiconductor chip 300 upwardly, the semiconductor package 30 may increase in structural stability. The supporters 600 may include or be formed of, for example, a dielectric material. FIG. 8 depicts that the supporter 600 is provided to every lead frame 400, but the present inventive concepts are not limited thereto. The supporters 600 may be interposed between the semiconductor chip 300 and the connection segments 430 of some of the lead frames 400.

Figure 9:
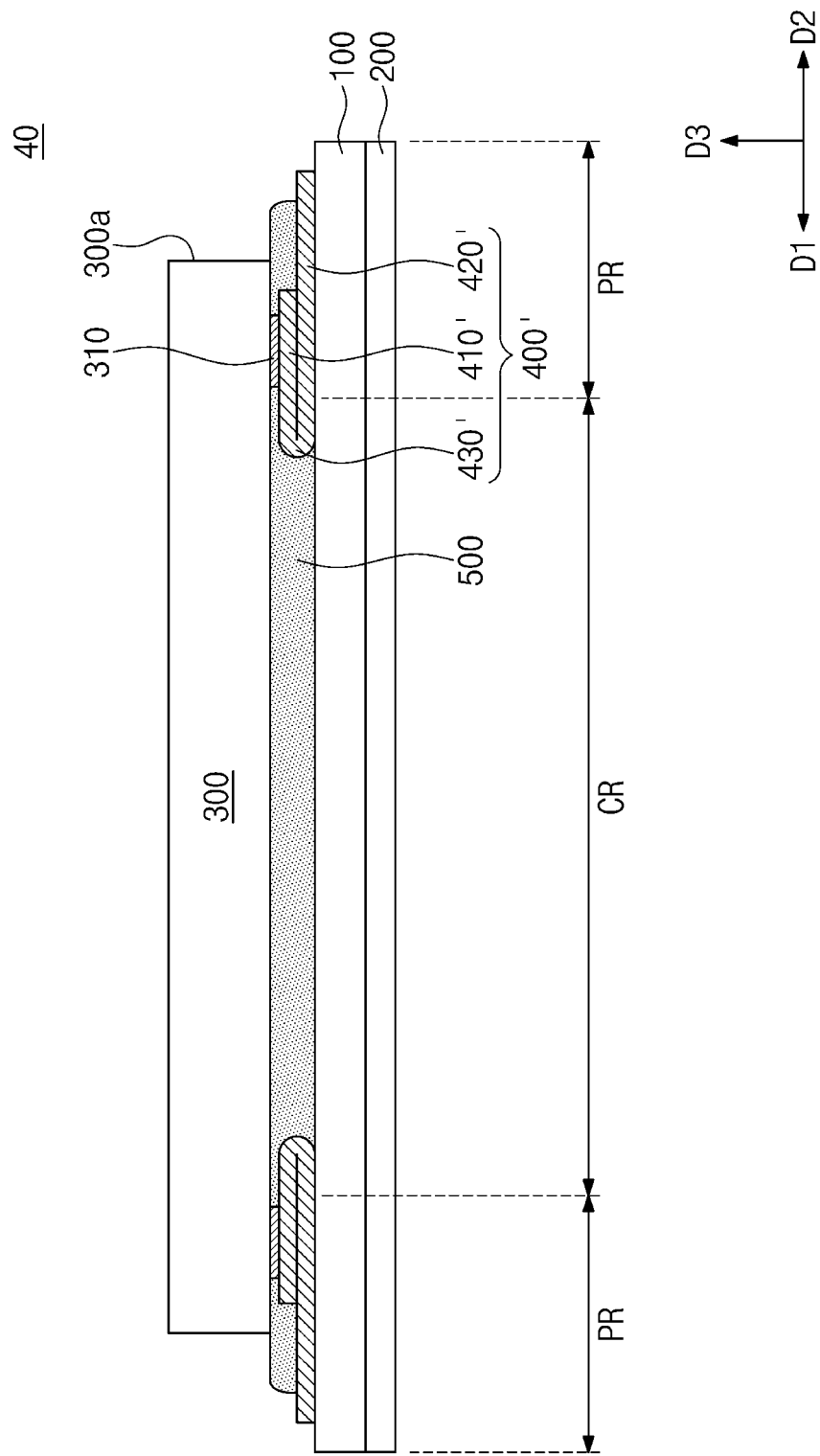
FIG. 9 is a cross-sectional view illustrating a semiconductor package according to some example embodiments of the present inventive concepts.
Figure 10:
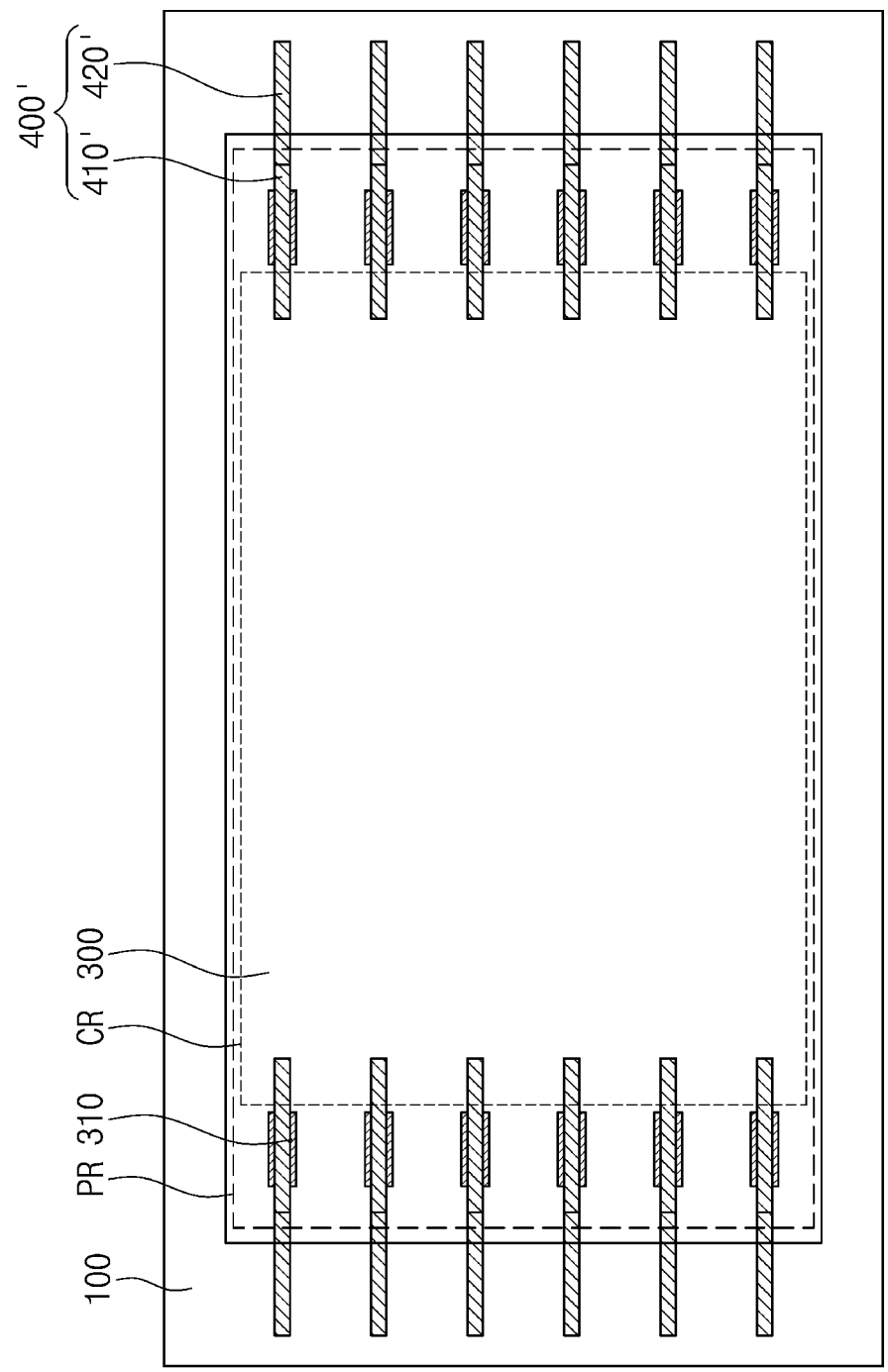
FIG. 10 is a plan view illustrating a semiconductor package according to some example embodiments of the present inventive concepts.

FIG. 9 is a cross-sectional view illustrating a semiconductor package according to some example embodiments of the present inventive concepts. FIG. 10 is a plan view illustrating a semiconductor package according to some example embodiments of the present inventive concepts.

Referring to FIGS. 9 and 10, a semiconductor package 40 may include a substrate 100, a thermal radiation member 200 provided on one surface of the substrate 100, lead frames 400' provided on another surface of the substrate 100, and a semiconductor chip 300 mounted on the substrate 100. For example, the semiconductor package 40 may be a chip-on-film (COF) type semiconductor device.

The thermal radiation member 200 may be disposed on a bottom surface of the substrate 100. The thermal radiation member 200 may contact the bottom surface of the substrate 100.

The semiconductor chip 300 may be mounted on the substrate 100. The semiconductor chip 300 may include chip pads 310 provided on a front surface thereof. The chip pads 310 may be positioned on a peripheral region PR of the semiconductor chip 300. The semiconductor chip 300 may be coupled to the lead frames 400' provided on a top surface of the substrate 100.

The lead frames 400' may be provided on the substrate 100 and connected to the chip pads 310 of the semiconductor chip 300. The lead frames 400' may each include a first segment 410' connected to the chip pad 310, a second segment 420' that extends from the first segment 410' toward an outside of the semiconductor chip 300, and a connection segment 430' that connects the first segment 410' to the second segment 420'. The lead frames 400' may each have a bent shape such as J-shape (when viewed in a cross-section), in which the lead frame 400' folds on itself in the third direction D3 perpendicular to a top surface of the substrate 100.

The first segment 410' may have a straight, linear shape that extends in the first direction D1 from a bottom surface 310c of the chip pad 310. The first segment 410' may extend in a direction directed from the chip pad 310 toward a central region CR of the semiconductor chip 300. For example, the first segment 410' may protrude from a second lateral surface 310b of the chip pad 310. The first segment 410' may have a first end (e.g., where the first segment 410' connects to the third segment 430') positioned on the central region CR. The first segment 410' may have a second end (e.g., terminal end) positioned on the peripheral region PR. For example, the first segment 410' may have a portion that protrudes from a first lateral surface 310a of the chip pad 310, from a plan view.

The second segment 420' may have a linear shape that extends in a direction from the central region CR toward the peripheral region PR. The second segment 420' may have a third end (e.g., where the second segment 420' connects to the third segment 430') positioned on the central region CR. When viewed in a plan view, the second segment 420' may protrude beyond a third lateral surface 300a of the semiconductor chip 300 after passing through the peripheral region PR from the central region CR. The third end of the second segment 420' may be positioned on the central region CR. The second segment 420' may have a fourth end (e.g., a terminal end) positioned on an outside of the semiconductor chip 300. The fourth end of the second segment 420' may correspond to a terminal to which an external output apparatus is coupled. The second segment 420' may be disposed in the third direction D3 from the first segment 410'. The first segment 410' may be spaced apart in the third direction D3 from the second segment 420' or may contact the second segment 420' without any space therebetween, to be disposed directly on the second segment 420'. The third direction D3 may be defined to refer to a direction perpendicular to the top surface of the substrate 100.

The first and second segments 410' and 420' may be connected to each other. For example, the first end of the first segment 410' and the third end of the second segment 420' may be connected through the connection segment 430' to each other on the central region CR. The connection segment 430' may be positioned on the central region CR. The first end of the first segment 410' and the third end of the second segment 420' may be connected to each other through a connection segment 430' that extends, for example in a straight line, in the third direction D3. Alternatively, as depicted in FIG. 9, the connection segment 430' may have a curved shape that bends in a curved manner from the first end of the first segment 410' toward the third end of the second segment 420'. Therefore, the lead frames 400' may each have a bent shape such as U shape (e.g., with one elongated end), or J shape or hook shape (or compressed hook shape) including the first segment 410' that extends from the chip pad 310 toward the central region CR of the semiconductor chip 300, the connection segment 430' that connects the first segment 410' to the second segment 420', and the second segment 420' that extends from the central region CR toward the peripheral region PR. The lead frames 400' may have their shapes each of which folds in the third direction perpendicular to a top surface of the substrate 100. As described in the various embodiments above (e.g., FIGS. 3-10), the lead frames have three segments that form a bent shape that is bent 180 degrees from end to end, for example, to form a hook shape or J shape. Other hook shapes could be formed, however, which are bent at less than 180 degrees and more than 90 degrees.

Figure 11:
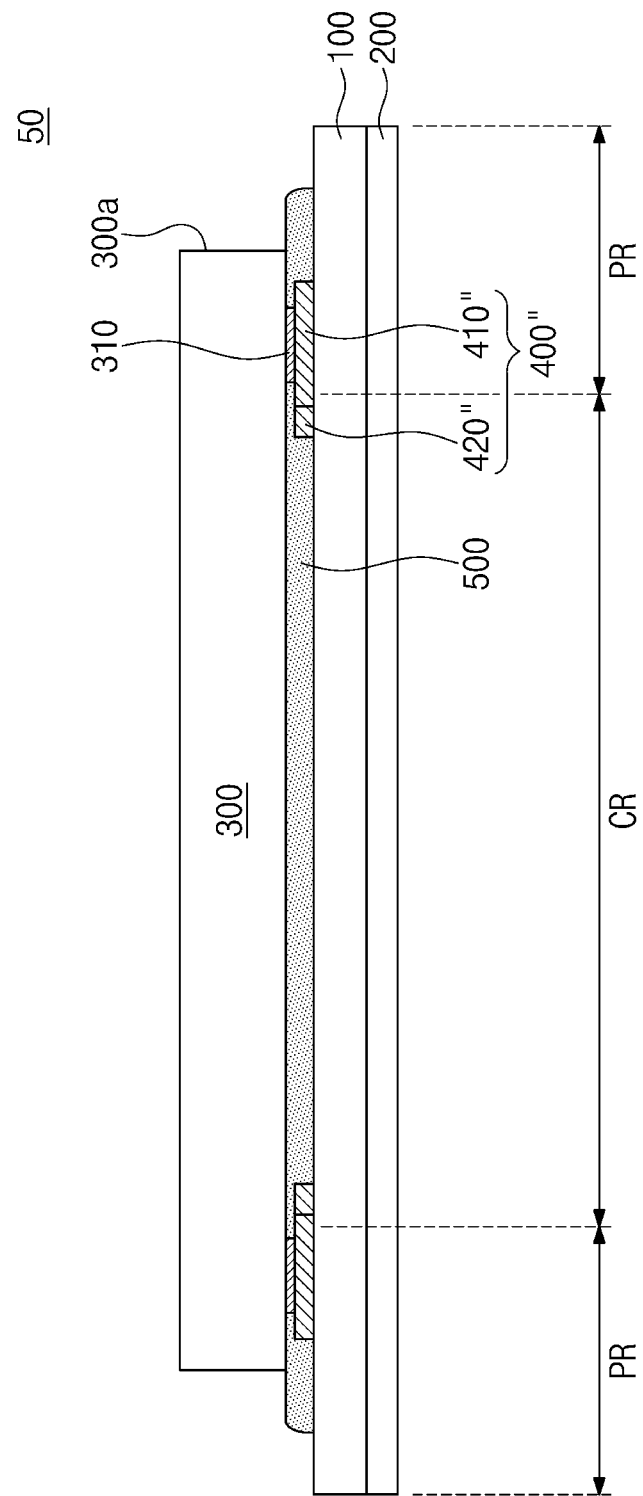
FIG. 11 is a cross-sectional view illustrating a semiconductor package according to some example embodiments of the present inventive concepts.
Figure 12:
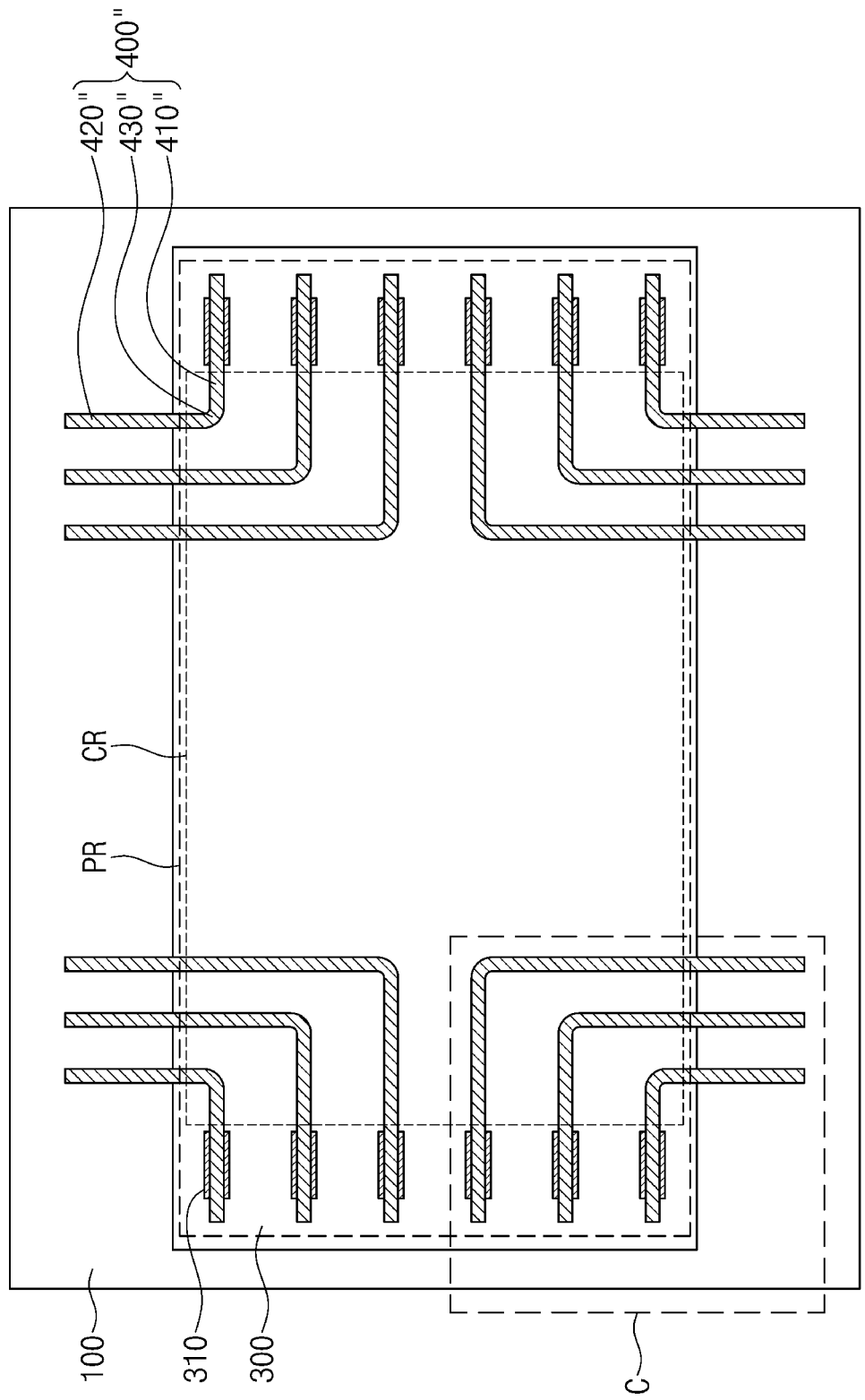
FIG. 12 is a plan view illustrating a semiconductor package according to some example embodiments of the present inventive concepts.
Figure 13:
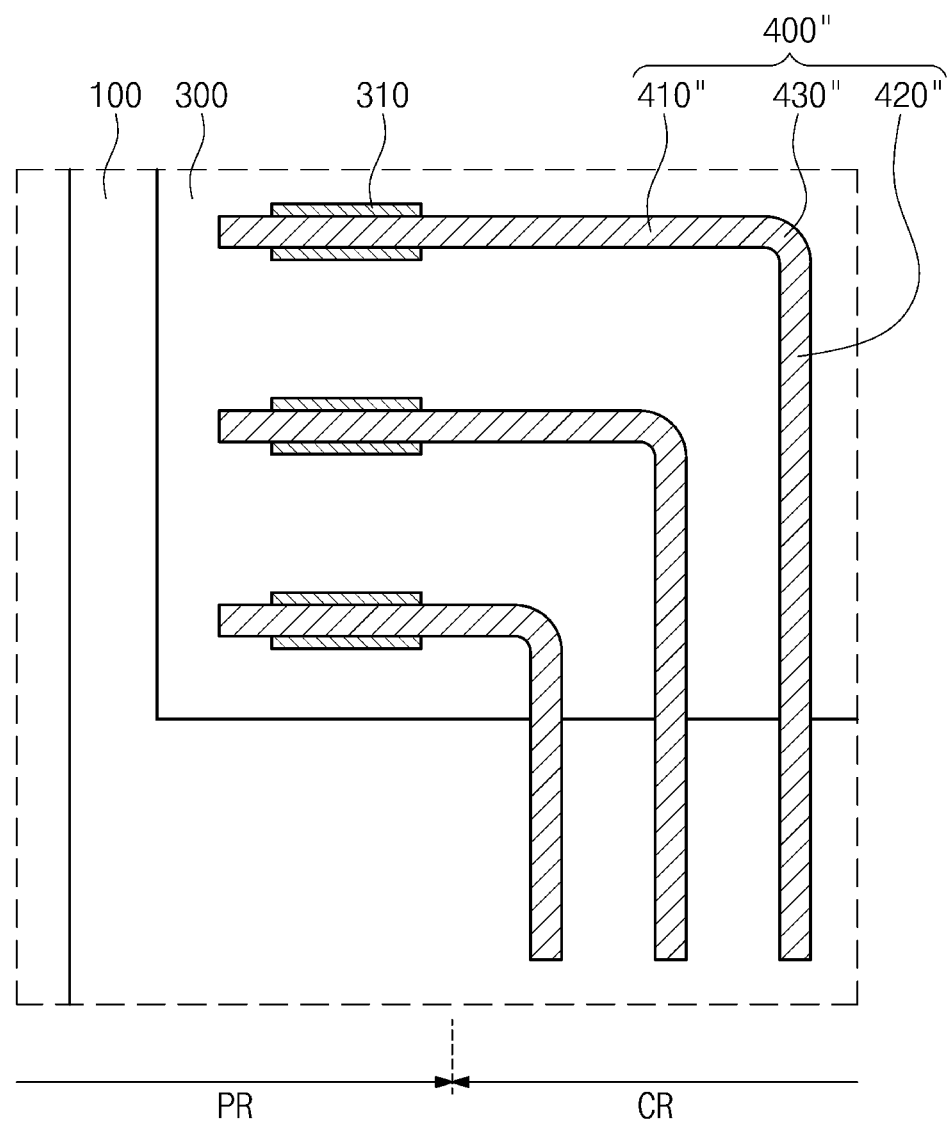
FIG. 13 is an enlarged view illustrating section C of FIG. 12.

FIG. 11 is a cross-sectional view illustrating a semiconductor package according to some example embodiments of the present inventive concepts. FIG. 12 is a plan view illustrating a semiconductor package according to some example embodiments of the present inventive concepts. FIG. 13 is an enlarged view illustrating section C of FIG. 12.

Referring to FIGS. 11 to 13, a semiconductor package 50 may include a substrate 100, a thermal radiation member 200 provided on one surface of the substrate 100, lead frames 400" provided on another surface of the substrate 100, and a semiconductor chip 300 mounted on the substrate 100. For example, the semiconductor package 50 may be a chip-on-film (COF) type semiconductor device.

The thermal radiation member 200 may be disposed on a bottom surface of the substrate 100. The thermal radiation member 200 may contact the bottom surface of the substrate 100.

The semiconductor chip 300 may be mounted on the substrate 100. The semiconductor chip 300 may include chip pads 310 provided on a front surface thereof. The chip pads 310 may be positioned on a peripheral region PR of the semiconductor chip 300. The semiconductor chip 300 may be coupled to the lead frames 400" provided on a top surface of the substrate 100.

The lead frames 400" may be provided on the substrate 100 and connected to the chip pads 310 of the semiconductor chip 300.

The lead frames 400" may each have a bent shape such as an L shape that extends from the chip pad 310 toward a central region CR of the semiconductor chip 300 and then extends from the central region CR toward the peripheral region PR. For example, the lead frames 400" may each include a first segment 410" connected to the chip pad 310, a second segment 420" that extends from the central region CR toward an outside of the semiconductor chip 300, and a connection segment 430" that connects the first segment 410" to the second segment 420".

The first segment 410" may have a straight, linear shape that extends in the first direction D1 from a bottom surface 310c of the chip pad 310, in a plan view. The first segment 410" may extend in the first direction D1 from the chip pad 310. For example, the first segment 410" may protrude from a second lateral surface 310b of the chip pad 310. The first segment 410" may have a first end positioned in the first direction D1 from the chip pad 310. The first segment 410" may have a second end positioned in the second direction D2 from the chip pad 310.

The second segment 420" may have a linear shape that extends in the third direction D3 from the central region CR. The second segment 420" may have a third end positioned on the central region CR. When viewed in plan, the second segment 420" may protrude beyond a third lateral surface 300a of the semiconductor chip 300 after passing through the peripheral region PR from the central region CR. The third end of the second segment 420" may be positioned on the central region CR. The second end of the second segment 420" may be positioned on an outside of the semiconductor chip 300.

The first and second segments 410" and 420" may be connected to each other. For example, the first end of the first segment 410" and the third end of the second segment 420" may be connected through the connection segment 430" to each other on the central region CR. The connection segment 430" may be positioned on the central region CR. The connection segment 430" may have a straight angular shape, or a curved, rounded shape. The second segment 420" may have a linear shape that extends in the third direction D3 from the connection segment 430" toward an outside of the semiconductor chip 300. Therefore, the lead frames 400" may each have an L shape (with an angled or rounded corner) including the first segment 410" that extends from the chip pad 310 toward the central region CR of the semiconductor chip 300, the connection segment 430" that connects the first segment 410" to the second segment 420", and the second segment 420" that extends from the central region CR toward the peripheral region PR.

According to some example embodiments of the present inventive concepts, a semiconductor package may include a lead frame that extends, from a bottom surface of a chip pad, in an inward direction toward where stress is less produced, and therefore the semiconductor package may be more highly resistant to heat-induced stress. Thus, the semiconductor package may be provided to have improved structural stability.

In addition, because lead frames are free of cracks, the lead frames may decrease in resistance, and the semiconductor package may increase in electrical characteristics.

Although the present inventive concepts have been described in connection with some example embodiments of the present disclosure illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
   a semiconductor chip;
   a first chip pad on a bottom surface of the semiconductor chip and adjacent to a first lateral surface of the semiconductor chip, the first lateral surface separated from the first chip pad from a plan view in a first direction; and
   a first lead frame coupled to the first chip pad,
   wherein the first lead frame includes:
      a first segment on a bottom surface of the first chip pad, the first segment extending in a second direction from the first chip pad, the second direction being opposite to the first direction and away from the first lateral surface of the semiconductor chip; and
      a second segment which connects to a first end of the first segment and then extends along the first direction to extend beyond the first lateral surface of the semiconductor chip after passing one side of the first chip pad, when viewed in the plan view.

2. The semiconductor package of claim 1, wherein a connection segment between the first and second segments is spaced apart from the first chip pad in the second direction.

3. The semiconductor package of claim 2, wherein the connection segment has a linear shape which extends in a third direction from the first end of the first segment toward a first end of the second segment, the third direction being parallel to the bottom surface of the semiconductor chip and perpendicular to the first and second directions.

4. The semiconductor package of claim 2, wherein the connection segment has a curved U shape which extends from the first end of the first segment to a first end of the second segment.

5. The semiconductor package of claim 2, further comprising a supporter between the connection segment and the bottom surface of the semiconductor chip.

6. The semiconductor package of claim 1, wherein the second segment is spaced apart in a third direction from the first segment, the third direction being parallel to the bottom surface of the semiconductor chip and perpendicular to the first and second directions.

7. The semiconductor package of claim 6, wherein the second segment is spaced apart in the third direction by a distance of about 10 μm to about 100 μm from the first segment.

8. The semiconductor package of claim 1, wherein the second segment is provided on a bottom surface of the first segment to overlap from a plan view.

9. The semiconductor package of claim 8, wherein a region where the first and second segments overlap each other is positioned below the first chip pad.

10. The semiconductor package of claim 1, wherein a distance in the first direction from a first lateral surface of the first chip pad to the first lateral surface of the semiconductor chip is about 0.1% to about 10% of a width of the semiconductor chip, the width being measured in the first direction.

11. The semiconductor package of claim 1, further comprising:
    a second chip pad on the bottom surface of the semiconductor chip and adjacent to the first lateral surface of the semiconductor chip, the second chip pad being spaced apart in a third direction from the first chip pad, the third direction being parallel to the bottom surface of the semiconductor chip and perpendicular to the first and second directions; and
    a second lead frame coupled to the second chip pad,
    wherein the second lead frame includes:
       a first segment on a bottom surface of the second chip pad, the first segment extending in the second direction from the second chip pad; and
       a second segment which connects to a first end of the first segment and then extends along the first direction to extend beyond the first lateral surface of the semiconductor chip after passing one side of the second chip pad, when viewed in the plan view.

12. The semiconductor package of claim 11, wherein
    the second segment of the first lead frame is spaced apart in a direction from the first segment of the first lead frame, the direction being opposite to the third direction, and
    the second segment of the second lead frame is spaced apart in the third direction from the first segment of the second lead frame.

13. The semiconductor package of claim 1, further comprising:
    a substrate below the semiconductor chip, wherein the substrate supports the first lead frame; and
    a thermal radiation member on a bottom surface of the substrate.

14. The semiconductor package of claim 13, further comprising an under-fill member which surrounds the first chip pad and fills a space between the substrate and the semiconductor chip.

15. A semiconductor package, comprising:
    a thermal radiation member;
    a substrate on the thermal radiation member;
    a lead frame on the substrate;
    a semiconductor chip which is disposed on the lead frame and whose bottom surface has a central region and a peripheral region which surrounds the central region; and
    a chip pad which is provided on the peripheral region of the bottom surface of the semiconductor chip and which couples the semiconductor chip to the lead frame,
    wherein the lead frame includes:
       a first segment which extends from a bottom surface of the chip pad onto the central region of the bottom surface of the semiconductor chip;
       a second segment which extends from the central region toward an outside of the semiconductor chip; and a connection segment through which the first segment and the second segment are connected to each other on the central region.

16. The semiconductor package of claim 15, wherein
the first segment has a straight linear shape which extends in a first direction from the chip pad toward the connection segment, the first direction being parallel to the bottom surface of the semiconductor chip, and
the second segment has a straight linear shape which extends in a direction from the connection segment, the direction being opposite to the first direction.

17. The semiconductor package of claim 16, wherein the first segment and the second segment are spaced apart from each other in a second direction parallel to the bottom surface of the semiconductor chip, the second direction intersecting the first direction.

18. The semiconductor package of claim 16, wherein the connection segment has a shape which extends in a second direction parallel to the bottom surface of the semiconductor chip, the second direction intersecting the first direction.

19. The semiconductor package of claim 15, wherein a distance from a first lateral surface of the chip pad to a first lateral surface of the semiconductor chip is about 0.1% to about 10% of a width of the semiconductor chip, the first lateral surface of the chip pad being directed toward the central region, the first lateral surface of the semiconductor chip being adjacent to the chip pad, and the width being measured in a direction from the first lateral surface of the chip pad toward the first lateral surface of the semiconductor chip.

20. A semiconductor package, comprising:
a thermal radiation member;
a substrate on the thermal radiation member;
a lead frame on the substrate, the lead frame having a hook shape in which a first end of a first segment is connected to a first end of a second segment, the first and second segments extending in a first direction; and
a semiconductor chip which includes a chip pad coupled to the first segment,
wherein a connection segment that connects the first and second segments to each other is more distant than the chip pad from a first lateral surface of the semiconductor chip, the first lateral surface being adjacent to the chip pad.

* * * * *